United States Patent [19]

Riley

[11] Patent Number: 4,691,170

[45] Date of Patent: Sep. 1, 1987

[54] FREQUENCY MULTIPLIER CIRCUIT

[75] Inventor: Mack W. Riley, Austin, Tex.

[73] Assignee: International Business Machines Corporation, Armonk, N.Y.

[21] Appl. No.: 837,997

[22] Filed: Mar. 10, 1986

[51] Int. Cl.[4] .................. H03K 3/78; H03K 5/156
[52] U.S. Cl. ............................... 328/20; 377/47; 307/219.1; 307/228
[58] Field of Search ............... 377/47; 328/15, 20; 307/219.1, 261, 271, 228

[56] References Cited

U.S. PATENT DOCUMENTS

| | | | |
|---|---|---|---|
| 2,992,326 | 7/1961 | Kahn | 328/15 |
| 3,443,463 | 5/1969 | Campbell | 307/219.1 |
| 3,445,685 | 5/1969 | Roth | 328/15 |
| 3,551,826 | 12/1970 | Sepe | 328/160 |
| 3,673,391 | 6/1972 | Lougheed | 235/150.3 |
| 3,739,156 | 6/1973 | Gebelein, Jr. et al. | 235/150.3 |
| 3,743,946 | 7/1973 | Gass et al. | 328/110 |
| 3,786,357 | 1/1974 | Belle Isle | 328/38 |
| 3,798,564 | 3/1974 | Langham | 331/1 A |
| 3,922,593 | 11/1975 | McGuffin et al. | 307/219.1 |
| 3,970,954 | 7/1976 | Even | 331/53 |
| 4,025,866 | 5/1977 | Fletcher et al. | 328/38 |
| 4,244,027 | 1/1981 | Shai | 364/703 |
| 4,339,722 | 7/1982 | Sydor et al. | 328/38 |
| 4,596,954 | 6/1986 | Haque | 307/219.1 |

FOREIGN PATENT DOCUMENTS

| | | | |
|---|---|---|---|
| 1177695 | 9/1964 | Fed. Rep. of Germany | 328/20 |
| 2212911 | 9/1973 | Fed. Rep. of Germany | 328/20 |
| 161118 | 9/1984 | Japan | 377/47 |
| 154711 | 8/1985 | Japan | 377/47 |
| 52369 | 10/1985 | Japan | 377/47 |

OTHER PUBLICATIONS

"Two Comparators on a One Chip Double TTL Signals to 50 HHZ", Electronic Design, Sep. 17, 1981, p. 187, by Dan Lieberman.

IBM Technical Disclosure Bulletin, vol. 26, No. 3A, Aug. 1983, pp. 990–991, entitled "Frequency Multiplier Using Delay Circuits", I. Hernandez, Jr.

IBM Technical Disclosure Bulletin, vol. 25, No. 12, May 1983, pp. 6556–6557, entitled "Frequency Doubler Exclusive-OR Circuit", K. Bernstein.

IBM Technical Disclosure Bulletin, vol. 25, No. 3A, Aug. 1982, pp. 1146–1147, entitled "Digital High Frequency Doubler Circuit", S. W. Roach.

IBM Technical Disclosure Bulletin, vol. 20, No. 7, Dec. 1977, p. 2606, entitled "FET Frequency Doubler", D. W. Kemerer.

IBM Technical Disclosure Bulletin, vol. 17, No. 9, Feb. 1975, p. 2710, entitled "Frequency Doubler", J. H. Hong.

IBM Technical Disclosure Bulletin, vol. 17, No. 6, Nov. 1974, pp. 1696–1699, entitled "Prime Factor Frequency Multiplication Mechanism", E. S. Caragliano and H. H. Nick.

IBM Technical Disclosure Bulletin, vol. 16, No. 5, Oct. 1973, pp. 1582–1583, entitled "Triac Frequency Multiplier", E. C. Heiman.

IBM Technical Disclosure Bulletin, vol. 14, No. 12, May 1972, pp. 3571–3572, entitled "Frequency Converter/-Power Multiplier", A. R. Johnson.

Linear LSI Data and Applications Manual–1985 from Signetics Corporation on pp. 9-188 and 9-189.

Primary Examiner—John S. Heyman
Attorney, Agent, or Firm—Thomas E. Tyson

[57] ABSTRACT

A frequency multiplier circuit including a circuit element to receive an input signal having a first frequency which is provided to a phase shifting circuit element to provide an intermediate signal resembling the input signal except shifted in phase. This intermediate signal is provided to a logic element which combines the intermediate frequency with the input signal to produce an output signal having a second frequency which is a multiple of the first frequency.

16 Claims, 3 Drawing Figures

FREQUENCY MULTIPLIER CIRCUIT

DESCRIPTION

1. Technical Field

This invention relates to a circuit that provides an output signal frequency that is some multiple of an input signal frequency.

2. Background Art

Frequency multipliers are used in electronic circuits to provide high frequency signals. Classically, frequency multiplier circuits included push-push or push-pull type amplifiers for use in radio frequency transmitters. More recently, frequency multiplier circuits have employed digital logic components to provide clocking signals.

One frequency multiplier is disclosed in U.S. Pat. No. 3,786,357 entitled "Digital Pulse Train Frequency Multiplier" which discloses a pair of digital differentiators that generate pulses at the leading and trailing edges of an input pulse to provide an output signal having a frequency double that of the input frequency.

A further technique is disclosed in U.S. Pat. No. 3,673,391 entitled "Digital Frequency Multiplying System" which includes an up-down counter connected to a second counter and a fixed oscillator to provide an output pulse train at a frequency related to the frequency of a sequence of input pulses.

DISCLOSURE OF THE INVENTION

In accordance with the present invention, a frequency multiplier circuit is provided that includes means for receiving an input signal having a first frequency and which is connected to a means for providing an output signal that is phase shifted from said input signal. The phase shifted output is provided to a logic element that combines the phase shifted output with the input signal to produce an output signal of a second frequency wherein the second frequency is a multiple of the first frequency.

In one embodiment of the present invention, the frequency multiplier circuit includes the means to alter the voltage amplitude of the input signal in providing the phase shifted signal. The altered amplitude signal is then integrated and provided to an exclusive OR gate which combined this input with the original input signal to provide the output siganl.

BRIEF DESCRIPTION OF THE DRAWING

The novel features believed characteristic of the invention are set forth in the appended claims. The invention itself, however, as well as other features and advantages thereof, will be best understood by reference to the following description of the preferred embodiment, when read in conjunction with the accompanied figures, wherein:

BEST MODE FOR CARRYING OUT THE INVENTION

The preferred embodiment is a frequency multiplier that provides a signal output of a frequency double that of the input signal frequency. This circuit is advantageous because it requires only a few components to provide the frequency doubling function. This type of circuit is useful for applications on printed high frequency signals used for clock signals when transmitted across the printed circuit cards may generate excessive electro-magnetic interference. The use of the present invention allows for low frequency signals, which generate less interference, to be transmitted across the printed circuit cards to specific areas on the card where the low frequency signal will be multiplied for use by circuit elements requiring a high frequency signal. Use of the frequency multiplier circuit in this manner would reduce the areas on the printed circuit card where the high frequency signals would be present and thus, reduce the level of electro-magnetic interference from the card.

Figure 1:
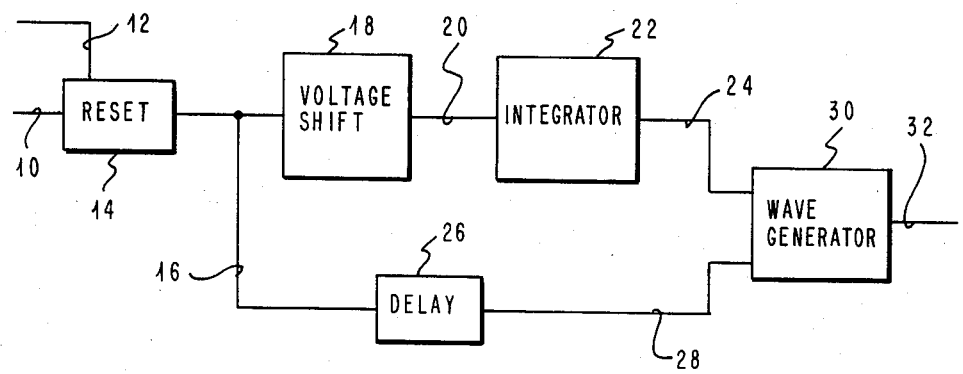
FIG. 1 is a block diagram of the multiplier circuit.
Figure 2:
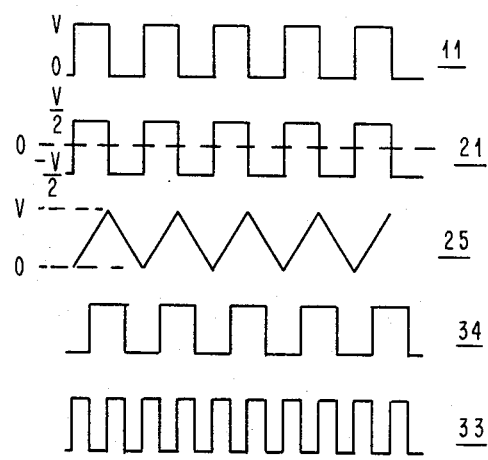
FIG. 2 is a timing diagram illustrating waveforms in the frequency multiplier circuit.

FIG. 1 is a block diagram of the frequency multiplier circuit. FIG. 2 illustrates the waveforms for signals at different locations in the block diagram of FIG. 1. Referring to FIG. 1, a reset circuit element 14 receives the input signal on line 10 and a reset signal on line 12. The input signal is illustrated in FIG. 2 as a squarewave waveform 11. The reset signal on line 12 can be used by external circuitry to turn off the frequency doubler circuit. The output of the reset circuit 14 is provided on line 16 to a voltage shift circuit 18 and a delay circuit 26. The output of reset circuit also resembles the waveform 11 of FIG. 2.

The voltage shift circuit 18 shifts the voltage amplitude of this input signal. In the preferred embodiment, the input signal waveform 11 includes an amplitude that varies between 0 and a voltage V or 5 volts. The voltage shift circuit 18 alters the waveform amplitude to vary between $-V/2$ volts to $+V/2$ volts as illustrated in waveform 21 of FIG. 2. For proper operation of this embodiment, the input squarewave waveform on line 16 must be shifted such that it is symmetrical about 0 volts. In other words, the waveform is symmetrical about 0 volts. This symmetrical waveform 21 is provided on line 20 to an integrator circuit element 22. The integrator circuit element 22 provides an output waveform 25 on line 24. The output waveform varies in amplitude between 0 and V volts. In the preferred embodiment, the input signal waveform 11 on line 16 is also provided to a delay circuit 26, which is merely a time delay identical to the time delay for the signal provided by the voltage shift circuit element 18 and the integrator circuit element 22. The output of the delay circuit element 26 is provided on line 28 and resembles the waveform 11. The signals on lines 24 and 28 are provided to the wave generator circuit element 30. The wave generator circuit element 30 inputs the sawtooth waveform 25 to form a square waveform 34 that is a phase shifted version of the input waveform 11. The waveform 34 and the waveform 11 are then combined in the wave generator circuit element 30 to provide a frequency doubled output signal on line 32. The output signal waveform on line 32 is illustrated as waveform 33 in FIG. 2.

Figure 3:
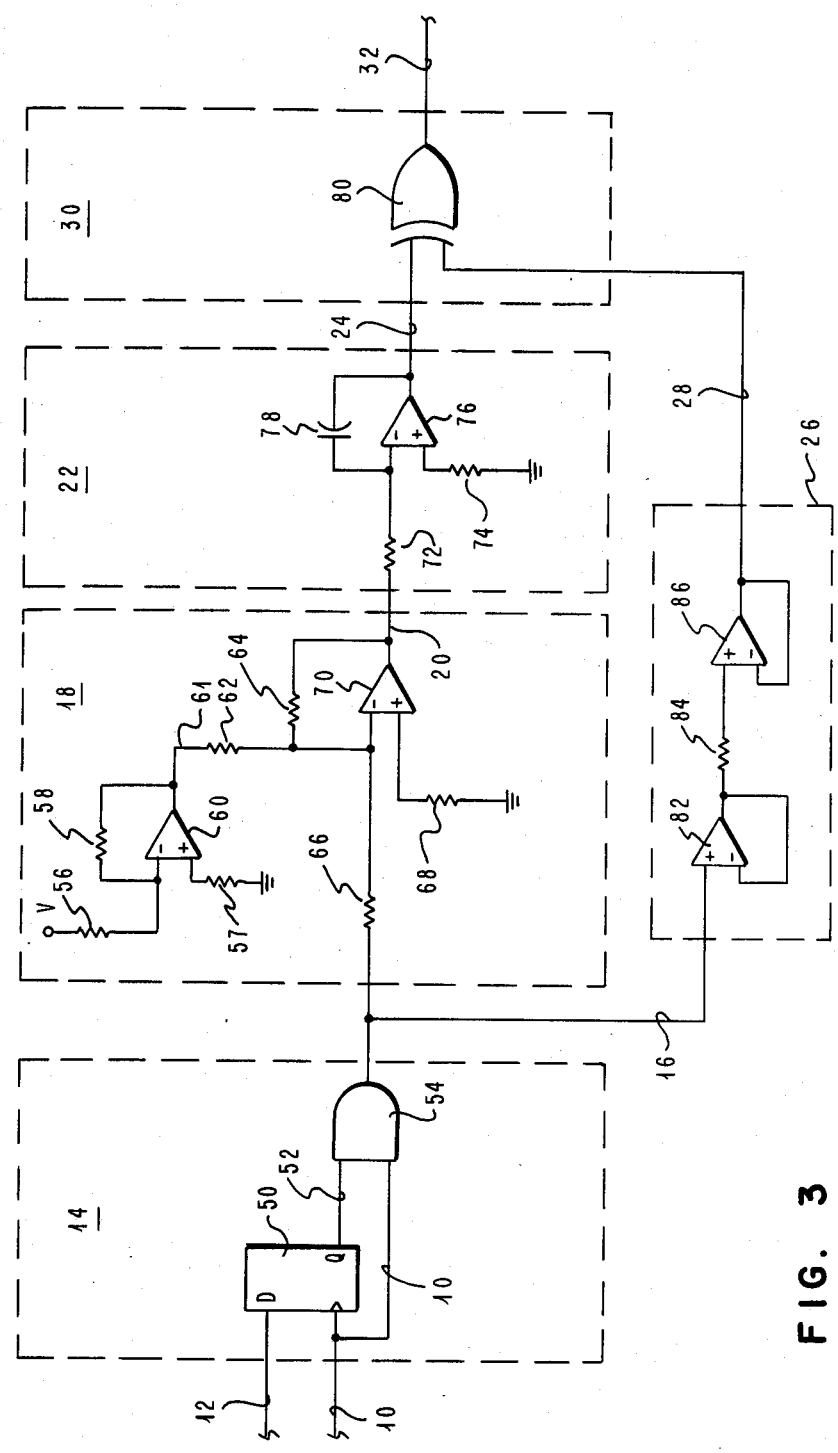
FIG. 3 is a schematic diagram of the frequency multiplier circuit.

FIG. 3 is a schematic diagram of the frequency multiplier circuit. The reset circuit element 14 is illustrated as including a D flip-flop 50 connected to an AND gate 54 to provide the output on line 16. The reset signal on line 12 provides the input to the D flip-flop 50 D terminal with the input signal on line 10 provided to the clock input to D flip-flop 50. The Q output from D flip-flop 50 is provided on line 52 along with the input signal on line 10 as the two inputs to the AND gate 54. The output of the AND gate 54 is the signal on line 16 previously discussed. The use of the D flip-flop 50 and AND gate 54 insure that the multiplier always starts on the rising edge of the input signal.

The voltage shift circuit element 18 is illustrated as including operational amplifiers 70 and 60. Operational amplifier 60 is connected to three resistors 56, 57 and 58 to form an inverting amplifier. In the preferred embodiment, resistor 56 is twice the resistance of resistance 58 to provide a gain of ½. The voltage input value V, in this preferred embodiment, corresponds to the maximum voltage amplitude of the input signal on line 10. The output voltage on line 61 is one-half of this voltage V. This voltage is input to resistor 62 which is one of a network of resistors including resistors 64, 66, and 68 connected with operational amplifier 70 forming a summing amplifier to provide the amplitude shifted waveform 21 of FIG. 2 on line 20.

The integrator circuit element 22 is illustrated as including operational amplifier 76, resistors 72 and 74, and capacitor 78. The output of the integrator circuit on line 24 is provided to the wave generator circuit element 30.

An explanation of summing amplifier, integrator and inverting amplifier design is contained in *Linear LSI Data and Applications Manual*, 1985 from Signetics, Inc. pages 9-188 and 9-189 herein incorporated by reference.

The input signal on line 16 is also provided to the delay circuit element 26 which includes two operational amplifiers 82 and 86 and resistor 84 to provide the time delay previously discussed. The output of the delay circuit element 26 on line 28 is also provided to the wave generator circuit 30.

The wave generator circuit 30 consists of an EXCLUSIVE OR gate 80. As previously discussed, the integrator circuit element 22 output on line 24 is a sawtooth waveform 25 (FIG. 2) which, when due to the trigger level of the EXCLUSIVE OR gate 80, is effectively the waveform 34 which resembles the waveform 11 shifted in phase by 180 degrees. This shifted waveform 34 is then combined with the waveform 11 from line 28 to produce the output waveform 33 on line 32.

In the preferred embodiment, the operational amplifiers 70, 76, 82 and 86 can be any high gain operational amplifier having a high slew rate such as a LH 0032 from National Semiconductor, Inc. Operation amplifier 60 does not have to have a high slew rate and a LM107 from National Semiconductor, Inc. would suffice.

Multiple frequency multiplier circuits can be cascaded to provide multiplier factors of greater than 2.

Although the invention has been described with reference to this specific embodiment, this description is not meant to be construed in a limiting sense. Various modifications of the disclosed embodiment, as well as other embodiments of the invention, will become apparent to those persons skilled in the art upon reference to the description of this invention. It is, therefore, contemplated that the appended claims will cover any such modifications or embodiments as fall within the true scope of the invention.

I claim:

1. A frequency multiplier circuit comprising:
   means for receiving an input signal of a first frequency having a signal amplitude symmetrical about a first reference;
   means for phase shifting said input signal including means for altering the input signal amplitude to be symmetrical about a second reference, said altering means connected to a means for integrating said altered signal and restoring the input signal amplitude to be symmetrical about the first reference;
   means for time delaying said input signal; and
   threshold means for logically combining said delayed input input signal and said phase shifted signal for producing an output signal of a second frequency, said second frequency being a multiple of said first frequency.

2. A frequency multiplier circuit according to claim 1 wherein said altering means includes means for changing the input signal voltage amplitude to be symmetrical about zero volts.

3. A frequency multiplier circuit according to claim 2 wherein said logical combining means is an EXCLUSIVE OR gate.

4. A frequency multiplier circuit according to claim 1 wherein said receiving means is a flip-flop 5. A frequency multiplier circuit according to claim 4 wherein said flip-flop is connected to receive a reset signal to reset the circuit.

6. A frequency multiplier circuit according to claim 4 wherein said input signal is a squarewave.

7. A frequency multiplier circuit according to claim 6 wherein said phase shifting means shifts said input signal by 180 degrees.

8. A frequency multiplier circuit according to claim 7 wherein said multiple of said first frequency is a power of two.

9. A frequency multiplier circuit comprising:
   means for receiving an input squarewave waveform signal having a first frequency and having a signal voltage amplitude symmetrical about a non-zero reference;
   means for producing a sawtooth waveform signal from said input signal including a means for changing the voltage amplitude of the input signal waveform to be symmetrical about zero volts connected to a means for integrating the symmetrical waveform and restoring the integrated signal to the original input signal voltage amplitude;
   means for time delaying said input squarewave waveform signal; and
   threshold means for logically combining the delayed input squarewave signal with the sawtooth waveform signal to produce a squarewave waveform output signal having a frequency twice the first frequency.

10. A frequency multiplier circuit comprising:
    means for receiving an input signal of a first frequency having a voltage amplitude symmetrical about a non-zero voltage reference;
    means for phase shifting said input signal including means for altering the input signal voltage amplitude to be symmetrical about zero volts;
    means for time delaying said input signal;
    a threshold EXCLUSIVE OR gate connected to said time delayed input signal and said phase shifted signal and producing an output signal of a second frequency, said second frequency being a multiple of said first frequency.

11. A frequency multiplier circuit according to claim 10 wherein said receiving means is a flip-flop.

12. A frequency multiplier circuit according to claim 10 wherein said receiving means is connected to receive a reset signal to reset the circuit.

13. A frequency multiplier circuit according to claim 12 wherein said input signal is a squarewave.

14. A frequency multiplier circuit according to claim 13 wherein said phase shifting means shifts said input signal by 180 degrees.

15. A frequency multiplier circuit according to claim 14 wherein said multiple of said first frequency is a power of two.

16. A frequency multiplier circuit comprising:

means for receiving an input squarewave waveform signal having a first frequency;

means for changing the amplitude of the input squarewave waveform signal;

means for integrating the waveform from the amplitude changing means to produce a sawtooth waveform signal;

means for time delaying the input signal;

threshold means for logically combining the delayed input signal with the sawtooth waveform signal to produce a squarewave waveform output signal having a frequency twice the first frequency.

* * * * *

UNITED STATES PATENT AND TRADEMARK OFFICE
CERTIFICATE OF CORRECTION

PATENT NO. : 4,691,170

DATED : September 1, 1987

INVENTOR(S) : M. W. Riley

It is certified that error appears in the above-identified patent and that said Letters Patent is hereby corrected as shown below:

Column 4, line 6, "input input signal and said phase shifted signal for" should read --input signal and said phase shifted signal for--.

Signed and Sealed this

Twenty-eighth Day of November 1989

Attest:

JEFFREY M. SAMUELS

*Attesting Officer*  *Acting Commissioner of Patents and Trademarks*